United States Patent
Fehmel et al.

(10) Patent No.: US 11,368,104 B2
(45) Date of Patent: Jun. 21, 2022

(54) POWER CONVERTER HAVING A POWER CONVERTER PATH

(71) Applicant: Siemens Energy Global GmbH & Co. KG, Munich (DE)

(72) Inventors: Mario Fehmel, Kemnath (DE); Sebastian Huettner, Nuremberg (DE); Martin Pieschel, Altdorf (DE); Peter Burkhardt, Speichersdorf (DE)

(73) Assignee: Siemens Energy Global GmbH & Co. KG, Munich (DE)

(*) Notice: Subject to any disclaimer, the term of this patent is extended or adjusted under 35 U.S.C. 154(b) by 118 days.

(21) Appl. No.: 16/643,044

(22) PCT Filed: Aug. 28, 2017

(86) PCT No.: PCT/EP2017/071530
§ 371 (c)(1),
(2) Date: Feb. 28, 2020

(87) PCT Pub. No.: WO2019/042524
PCT Pub. Date: Mar. 7, 2019

(65) Prior Publication Data
US 2020/0214161 A1    Jul. 2, 2020

(51) Int. Cl.
*H02M 7/483* (2007.01)
*H02M 7/00* (2006.01)
*H05K 7/14* (2006.01)

(52) U.S. Cl.
CPC .......... *H02M 7/483* (2013.01); *H02M 7/003* (2013.01); *H02M 7/4835* (2021.05); *H05K 7/1432* (2013.01)

(58) Field of Classification Search
CPC .... H02M 7/003; H02M 7/483; H02M 7/4835; H05K 7/1432
See application file for complete search history.

(56) References Cited

U.S. PATENT DOCUMENTS

| | | | |
|---|---|---|---|
| 4,318,169 A | 3/1982 | Olsson | |
| 4,583,158 A | 4/1986 | Ikekame et al. | |
| 6,259,616 B1 | 7/2001 | Ekwall et al. | |
| 2012/0057308 A1* | 3/2012 | Sihler | H02M 7/106 361/730 |

FOREIGN PATENT DOCUMENTS

| | | | | |
|---|---|---|---|---|
| WO | WO 2013000512 A1 | 1/2013 | | |
| WO | WO-2016170910 A1 * | 10/2016 | ............ | H02M 7/483 |
| WO | WO 2016170910 A1 | 10/2016 | | |

OTHER PUBLICATIONS

PCT International Search Report and Written Opinion of International Searching Authority dated May 23, 2018 corresponding to PCT International Application No. PCT/EP2017/071530 filed Aug. 28, 2017.

* cited by examiner

*Primary Examiner* — Jue Zhang
(74) *Attorney, Agent, or Firm* — Laurence A. Greenberg; Werner H. Stemer; Ralph E. Locher

(57) ABSTRACT

A power converter path of a modular multilevel power converter includes a multiplicity of modules forming an electrical series circuit. The series circuit includes four groups of modules, of which two successive or sequential groups are disposed one above the other in a tower structure. A modular multilevel power converter with a power converter path is also provided.

16 Claims, 11 Drawing Sheets

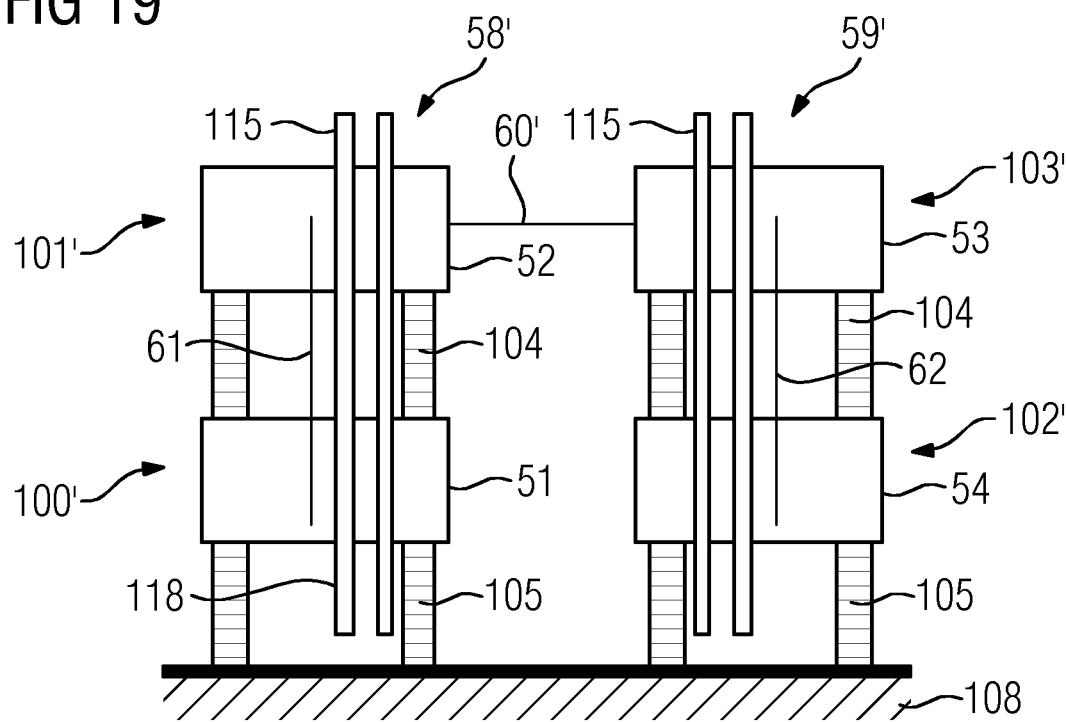
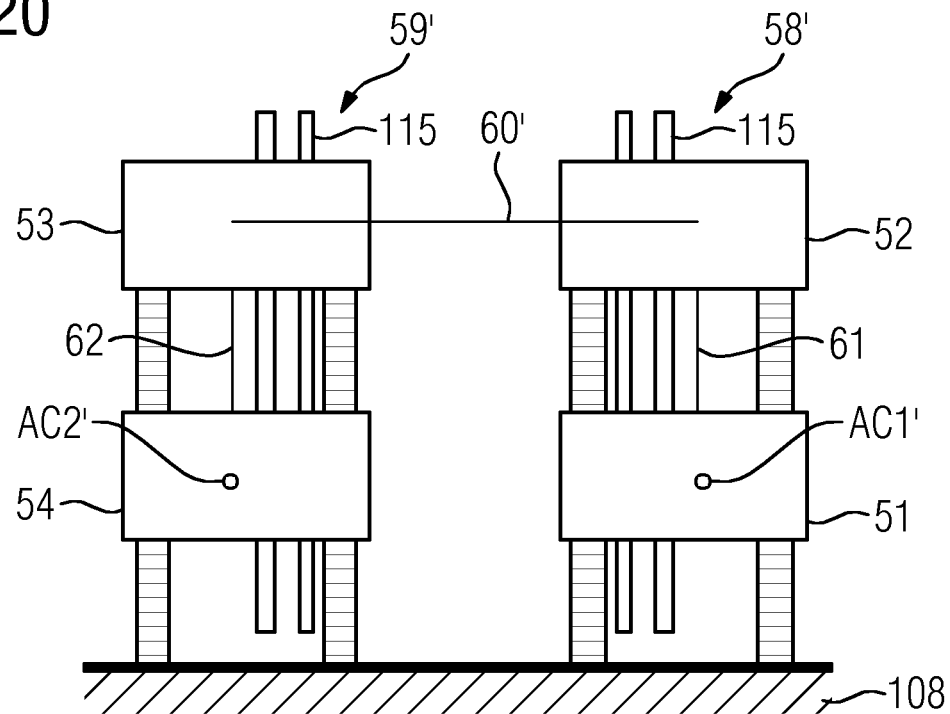

POWER CONVERTER HAVING A POWER CONVERTER PATH

BACKGROUND OF THE INVENTION

Field of the Invention

The invention relates to a power converter path of a modular multilevel power converter with a plurality of modules and to a modular multilevel power converter.

Modular multilevel power converters for high voltages are often erected in halls. The greater the terminal voltage of a modular multilevel power converter, the greater the insulation distances between points of the power converter at different potentials must be, and the longer the insulators—support insulators in particular—arranged in the power converter must be. This requires halls that are larger, in particular taller, and thereby also more expensive. Tall mechanical structures of the power converter are, moreover, more vulnerable to earthquake stresses. Large, tall halls may also increase the operating losses and the costs of air-conditioning the hall. While the mechanical structure of the power converter can be designed to be stiffer through elaborate stretching and tensioning insulators, additional insulation problems such as, for example, stronger partial discharges or the shortening of spark gaps, can however occur as a result.

SUMMARY OF THE INVENTION

The invention is based on the object of providing a power converter path of a modular multilevel power converter, and a modular multilevel power converter that can be constructed compactly and thereby economically.

This object is achieved according to the invention by a power converter path as claimed in the independent patent claim. Advantageous forms of embodiment of the power converter path are given in the dependent patent claims.

A power converter path of a modular multilevel power converter with a plurality of modules that form an electric series circuit is disclosed, wherein the series circuit comprises four (sequential) groups of modules, of which two sequential groups of the series circuit are arranged one above the other in a tower structure. It is particularly advantageous here that the series circuit comprises no more than four groups of modules, of which two sequential groups are arranged in the tower structure. In this way, a tower structure of a manageable height results, so that the power converter path can be constructed in a mechanically compact and comparatively low manner.

The power converter path can be designed in such a way that one of the two sequential groups is arranged on a lower level of the tower structure, and the other of the two sequential groups is arranged on an upper level of the tower structure. The tower structure thus only comprises two levels (the lower level and the upper level); the tower structure thus has a lower height than, for example, a tower structure with three or more levels. The height of the tower structure is thus limited to 2 levels or 2 planes (two-level tower structure). Stated in other words, the tower structure does not have a third level with a group of modules; it is a tower structure without a third level.

The power converter path can also be designed such that the power converter path comprises a first tower structure and a second tower structure that are arranged next to one another. Advantageously, the power converter path thus comprises two tower structures arranged next to one another: the first tower structure and the second tower structure. Through the realization of the power converter path with the two tower structures, it is ensured that each tower structure, considered in itself, has a comparatively low height. Each tower structure is designed to be mechanically self-supporting, meaning that each tower structure is mechanically stable in itself (independently of the other tower structure). The first two sequential groups of the series circuit are arranged one above the other in the first tower structure; the last two sequential groups of the series circuit are arranged one above the other in the second tower structure. Formulated otherwise, the first group and the second group of the series circuit comprise the first tower structure; the third group and the fourth group of the series circuit comprise the second tower structure. Stated in other words, the first group and the second group of the series circuit are associated with the first tower structure; the third group and the fourth group of the series circuit are associated with the second tower structure.

The power converter path can be designed such that the groups arranged in the first tower structure and the groups arranged in the second tower structure are electrically connected to one another by means of a first electric connecting conductor (and thereby form the electric series circuit). The first electric connecting conductor forms, in particular, the single electric connection between the first tower structure and the second tower structure. The electric series circuit of the modules is realized through the first electric connecting conductor; this electric series circuit extends through the first tower structure and the second tower structure.

The power converter path can be designed such that
the first electric connecting conductor electrically connects the group arranged on the lower level of the first tower structure to the group arranged on the lower level of the second tower structure, or
the first electric connecting conductor electrically connects the group arranged on the upper level of the first tower structure to the group arranged on the upper level of the second tower structure.

The first electric connecting conductor can thus be arranged at the height of the lower level of the two tower structures, or the electric connecting conductor can be arranged at the height of the upper level of the two tower structures. The first electric connecting conductor here preferably extends horizontally, and thus has a minimum length.

The power converter path can also be designed such that
the power converter path comprises a first path terminal (at its first end) and a second path terminal (at its second end),
the first path terminal is arranged at the first tower structure, and
the second path terminal is arranged at the second tower structure.

The power converter thus advantageously extends over the first tower structure and the second tower structure, so that both tower structures are used in order to realize the necessary insulation distances within the power converter path.

The power converter path can also be designed such that
the first path terminal is arranged on the lower level of the first tower structure, and the second path terminal is arranged on the lower level of the second tower structure, or
the first path terminal is arranged on the upper level of the first tower structure, and the second path terminal is arranged on the upper level of the second tower structure. In this way the position of the first path terminal and of the second path terminal can be adapted flexibly to the respective requirements. It is, in particular, advantageous if the first path terminal and the second path terminal are each arranged on the upper level of the tower structures. A free space then results underneath the path terminals, which is advantageous for better accessibility of the power converter path, during servicing or repair work in particular.

The power converter path can also be so designed that by means of a second electric connecting conductor, the (respective) group arranged on the upper level of the tower structure is electrically connected to the (respective) group arranged on the lower level of the tower structure, wherein this second connecting conductor is arranged at the side of the tower structure that is opposite the (respective) path terminal. This applies in each case to the first tower structure and the second tower structure.

The second electric connecting conductor here forms the single electric connection between the upper level and the lower level of the tower structure; put more precisely, between the group of modules arranged on the upper level and the group arranged on the lower level.

This second connecting conductor is advantageously arranged at the side of the tower structure that is opposite the path terminal. Particularly favorable voltage relationships result within the tower structure from this. The second connecting conductor preferably extends vertically.

The power converter path can be so designed that a current that flows through the (respective) group that is arranged on the upper level of the tower structure, the second connecting conductor and the (respective) group that is arranged on the lower level of the tower structure has a U-shaped current path. Such a U-shaped current path permits a particularly advantageous potential control of the power converter path.

The power converter path can be so designed that the first connecting conductor and/or the second connecting conductor is in each case an electric busbar. The high currents required can safely be carried in this way.

The power converter path can also be so designed that a cooling pipe for a fluid cooling (in particular for a liquid cooling system) of the modules is arranged at the side of the tower structure at which the second connecting conductor is arranged. The arrangement of the cooling pipe at that side of the tower structure at which the second connecting conductor is arranged is therefore advantageous because the second connecting conductor creates points with the same electric potential at the upper level and the lower level of the tower structure. If the cooling pipe is installed in the vicinity of these points of equal electric potential, problems resulting from compensating currents etc. are thereby avoided. The cooling pipe here can in particular consist of an electrically insulating material. A liquid with a very low electrical conductivity can be used as the cooling liquid. Alternatively, a section of the cooling pipe extending between the upper level and the lower level of the tower structure can consist of an electrically conductive material, while only a section of the cooling pipe extending between the lower level of the tower structure and the ground potential consists of an electrically insulating material. An electrically insulating section of the cooling pipe is not necessary between the upper level and the lower level of the tower structure, since the second connecting conductor creates points with the same electric potential at the upper level and the lower level of the tower structure.

The power converter path can also be so designed that the cooling pipe comprises a meandering section (in order to lengthen the leakage path between points of different electric potential, in particular to lengthen the leakage path between the ground potential and the electric potential of the lower level of the tower structure).

The power converter path can be so designed that the plane of the meandering section is arranged perpendicularly or parallel to a conceptual plane boundary surface that borders the outer contour of that side of the tower structure at which the second connecting conductor is arranged. The meandering section can thereby be adapted favorably to the circumstances of space.

The power converter path can also be so designed that each group of modules comprises between 8 and 16 modules. With this number of modules in each group, terminal voltages of up to 150 kV alternating voltage can advantageously be realized.

The power converter path can also be designed such that the modules each comprise at least two electronic switching elements and an electrical energy store. Modules of this sort are also referred to as submodules of a modular multilevel power converter.

A modular multilevel power converter with a power converter path as described in one of the previously described variants is furthermore disclosed.

BRIEF DESCRIPTION OF THE SEVERAL VIEWS OF THE DRAWING

The invention is explained in more detail below with reference to exemplary embodiments. The same reference signs here refer to elements that are the same or that act in the same way. Here FIGS. 17 to 20 illustrate a further exemplary embodiment of the mechanical construction of the power converter path.

DETAILED DESCRIPTION OF THE INVENTION

Figure 1:
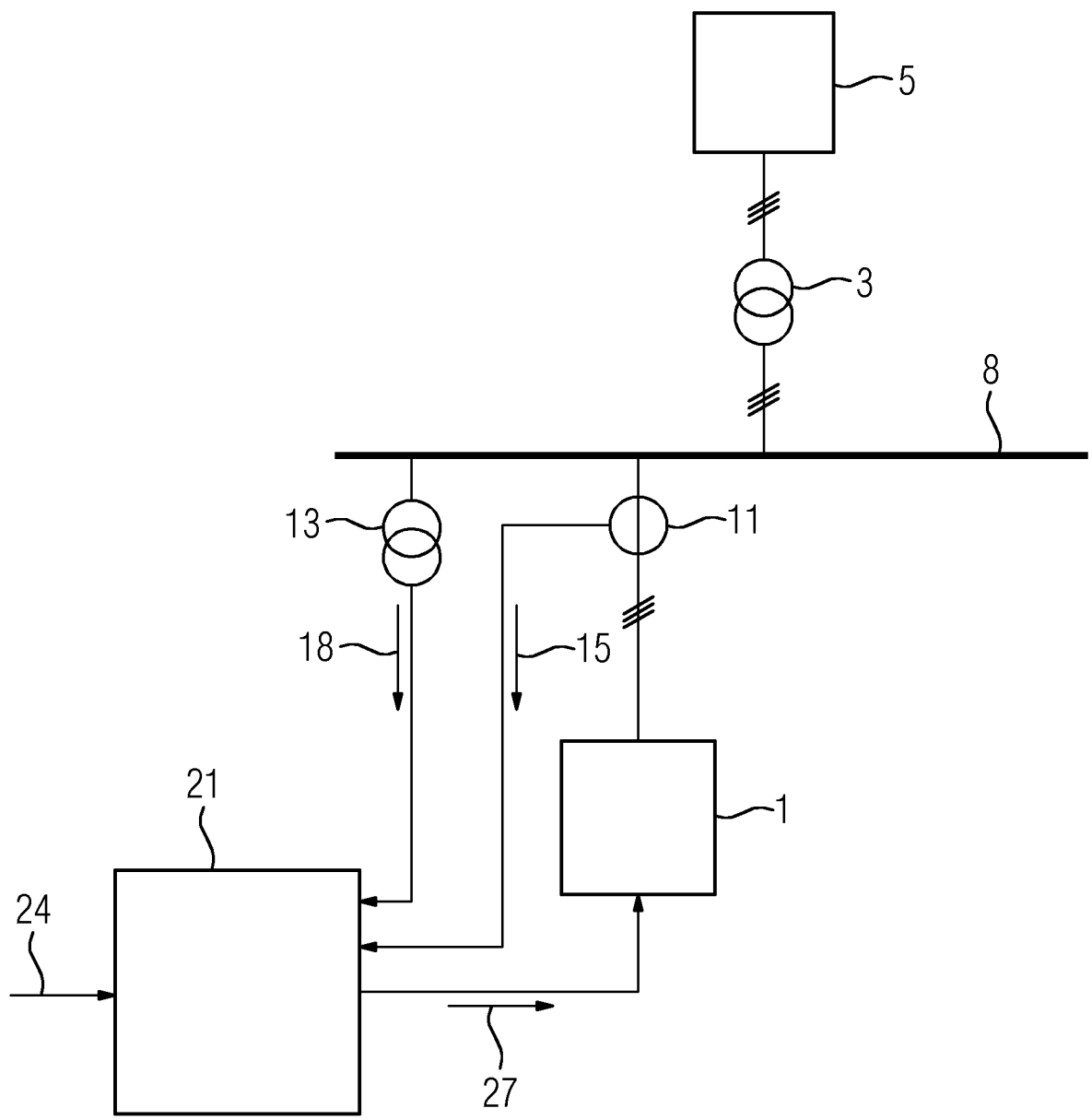
FIG. 1 illustrates an exemplary embodiment of a modular multilevel power converter connected to an energy supply network.

A modular multilevel power converter 1 that is connected via a transformer 3 to a three-phase electric alternating voltage network 5 (energy supply network 5) is illustrated in FIG. 1. A three-phase electric connection is established between the modular multilevel power converter 1 and the transformer 3 by means of a connecting rail 8. A current sensor 11 serves to measure the current flowing to the modular multilevel power converter 1. A voltage sensor 13 measures the voltage present at the connecting rail 8; this voltage corresponds to the voltage present at the modular multilevel power converter 1. Measured current values 15 of the current sensor 11 and measured voltage values 18 of the voltage sensor 13 are transmitted to a drive unit 21. The drive unit 21 generates drive signals 27 on the basis of these measured values 15, 18, and on the basis of target values 24, and thereby controls the multilevel power converter 1. The drive unit 21 processes the measured current values 15 and the measured voltage values 18 for this purpose. In the exemplary embodiment of FIG. 1, the modular multilevel power converter 1 is a reactive current compensator which can precisely influence the reactive power occurring in the connecting rail 8, and thereby also in the alternating voltage energy supply network 5.

Figure 2:
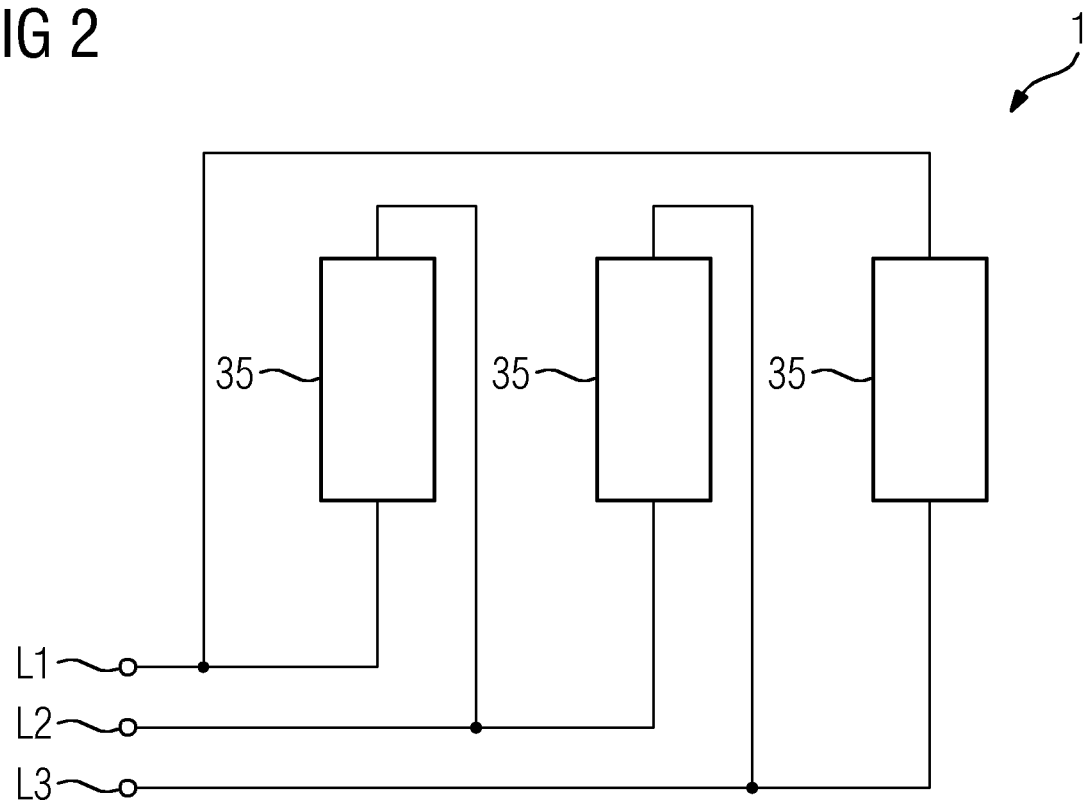
FIG. 2 illustrates an exemplary embodiment of a multilevel power converter in a delta circuit.

An exemplary embodiment of the modular multilevel power converter 1 that comprises three power converter paths 35 is illustrated in FIG. 2. The three power converter paths 35 are connected in a delta circuit and can be connected via three power converter terminals L1, L2 and L3 to the three phases of the three-phase alternating voltage network 5.

Figure 3:
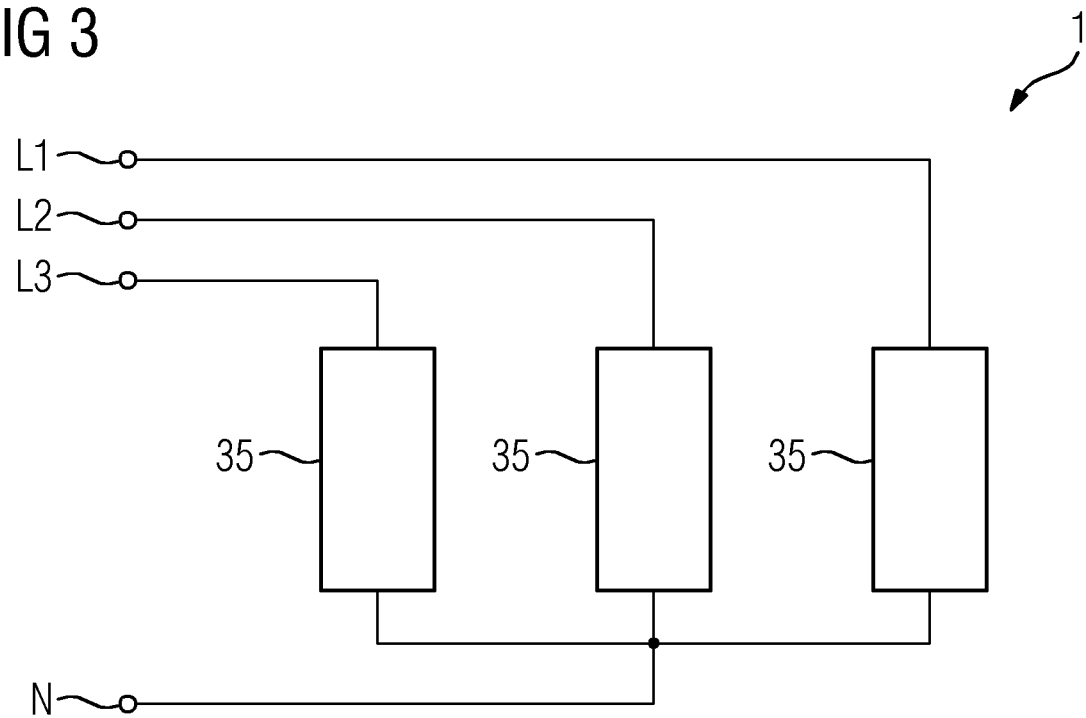
FIG. 3 illustrates an exemplary embodiment of a multilevel power converter in a star circuit.

An exemplary embodiment of the modular multilevel power converter 1 that comprises three power converter paths 35 that are connected in a star circuit is illustrated in FIG. 3. The neutral point of the star circuit can be connected via a return conductor terminal N to a return conductor of the three-phase alternating voltage network; the three phases of the alternating voltage network can be connected to the three power converter terminals L1, L2 and L3.

Figure 4:
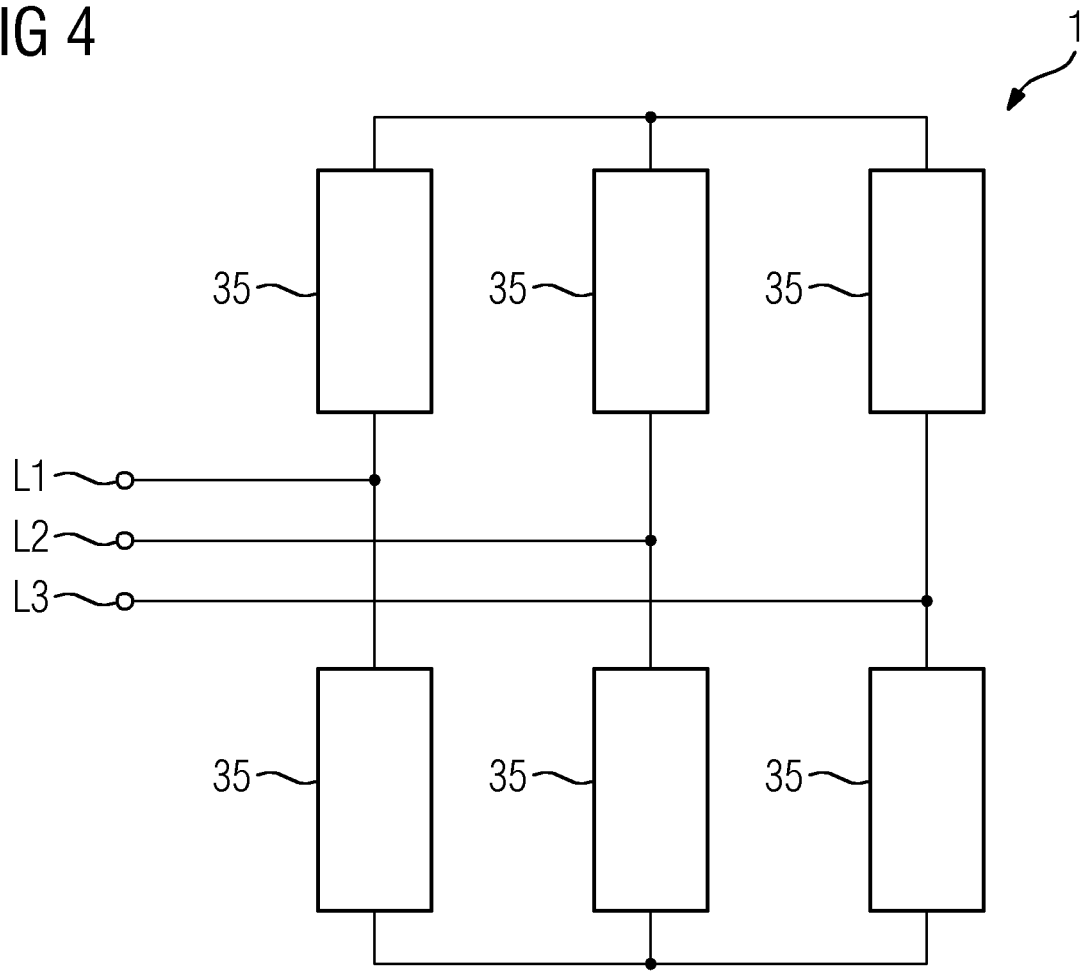
FIG. 4 illustrates an exemplary embodiment of a multilevel power converter in a bridge circuit.

A further exemplary embodiment of the modular multilevel power converter 1 is illustrated in FIG. 4. This modular multilevel power converter comprises six power converter paths 35 that are arranged in a bridge circuit. Two power converter paths 35 at a time are connected in series, and form a phase module of the modular multilevel power converter. A power converter terminal L1, L2 or L3, is in each case connected to the connecting point between the two series-connected power converter paths.

Figure 5:
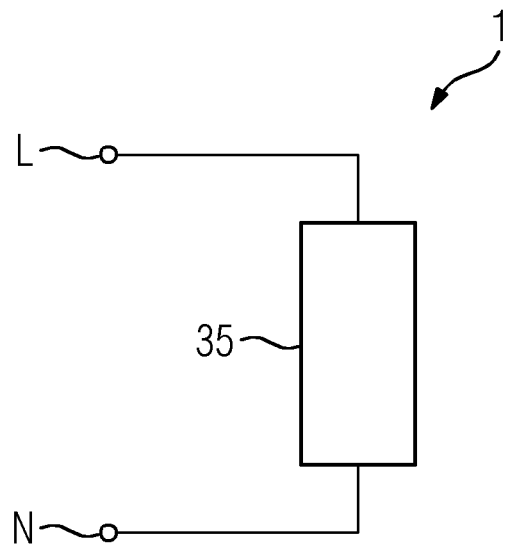
FIG. 5 illustrates an exemplary embodiment of a single-phase multilevel power converter.

An exemplary embodiment of a modular multilevel power converter 1 that only comprises a single power converter path 35 is illustrated in FIG. 5. This power converter path 35 comprises a single power converter terminal L for one phase of a single-phase alternating voltage network, and a return conductor terminal N for a return conductor of the alternating voltage network.

Figure 6:
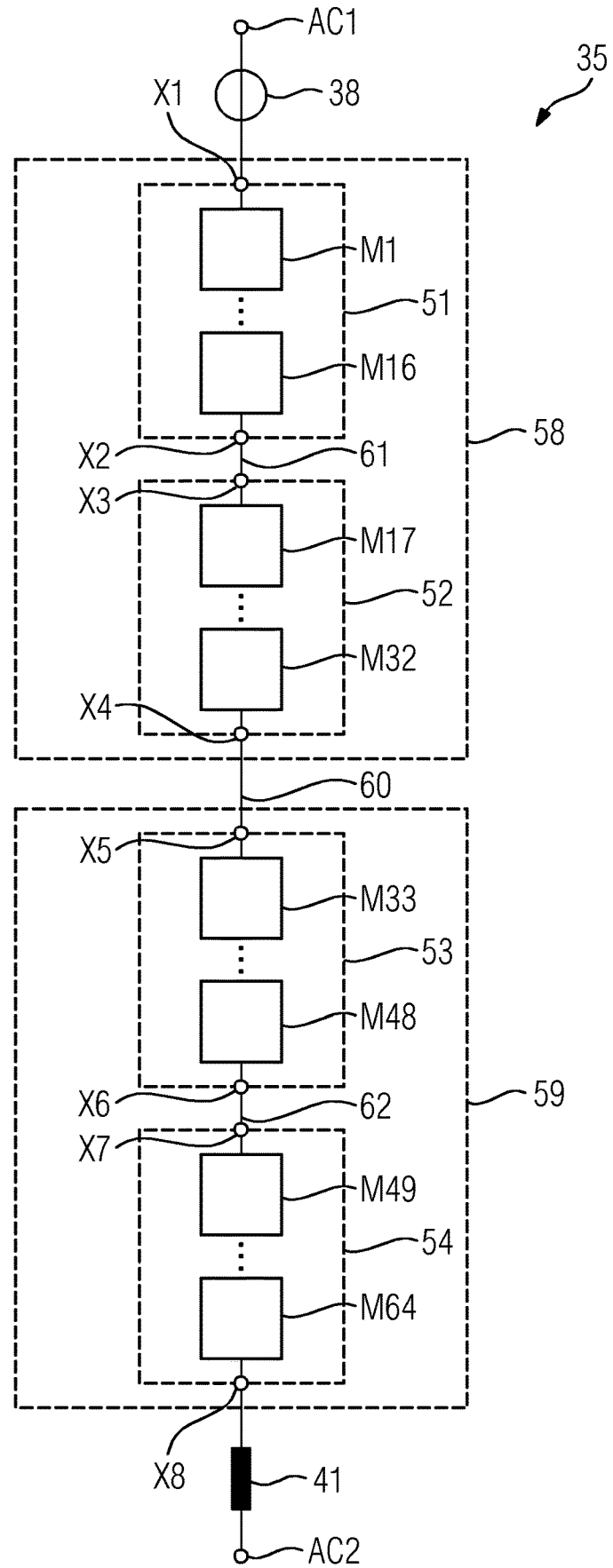
FIG. 6 illustrates an exemplary embodiment of a power converter path of a multilevel power converter.

An exemplary embodiment of the power converter path 35 is illustrated in FIG. 6. This power converter path 35 comprises a first path terminal AC1 and a second path terminal AC2. An electric series circuit of modules M1 to M64 extends between the two path terminals AC1 and AC2. This series circuit further optionally comprises a current sensor 38 for measurement of the current flowing through the power converter path 35, as well as a coupling inductor 41.

The modules M1 to M64 comprise four sequential groups 51, 52, 53 and 54 of modules. The first group 51 comprises the modules M1-M16, a first group terminal X1 of the first group and a second group terminal X2 of the first group. The second group 52 comprises the modules M17-M32, a first group terminal X3 of the second group and a second group terminal X4 of the second group. The third group 53 comprises the modules M33-M48, a first group terminal X5 and a second group terminal X6. The fourth group 54 comprises the modules M49-M64, a first group terminal X7 as well as a second group terminal X8. The four groups 51, 52, 53 and 54 are electrically connected in a series circuit. The modules of the first group 51 and of the second group 52 are arranged in a first tower structure 58; the modules of the third group 53 and of the fourth group 54 are arranged in a second tower structure 59. This is explained in more detail further below. Such a tower structure can also be referred to as a tower or even as a half-tower: the name half-tower indicates that two such tower structures are associated with the power converter path. The power converter path thus comprises two tower structures.

The modules of the first tower structure 58 are electrically connected by means of a first connecting conductor 60 to the modules of the second tower structure 59. The modules of the first group 51 are electrically connected by means of a second connecting conductor 61 to the modules of the second group 52. In a similar manner, the modules of the third group 53 are electrically connected by means of a further second connecting conductor 62 to the modules of the fourth group 54.

The power converter path in the exemplary embodiment comprises 64 modules. In other exemplary embodiments, the power converter path can, of course, also comprise a different number of modules, for example 32 modules or 128 modules. The power converter path 35 can also be referred to as a power converter module 35.

Figure 7:
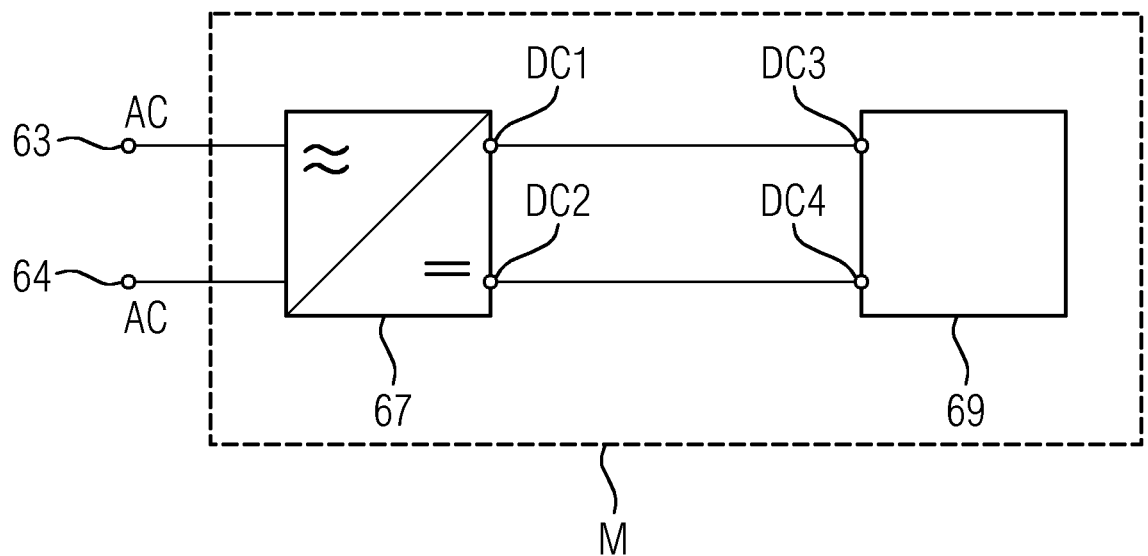
FIG. 7 illustrates an exemplary embodiment of a module of a multilevel power converter with a power module and a capacitor module.

An exemplary embodiment of a module M (for example of the module Ml or one of the other modules illustrated in FIG. 6) is illustrated in FIG. 7. The module M comprises two module terminals 63 and 64, which are connected to what is known as a power module 67. The power module 67 comprises two direct voltage terminals DC1 and DC2 which are electrically connected to two direct voltage terminals DC3 and DC4 of a capacitor module 69. The direct voltage terminals DC1 and DC2 form a direct voltage intermediate circuit of the module M.

Figure 8:
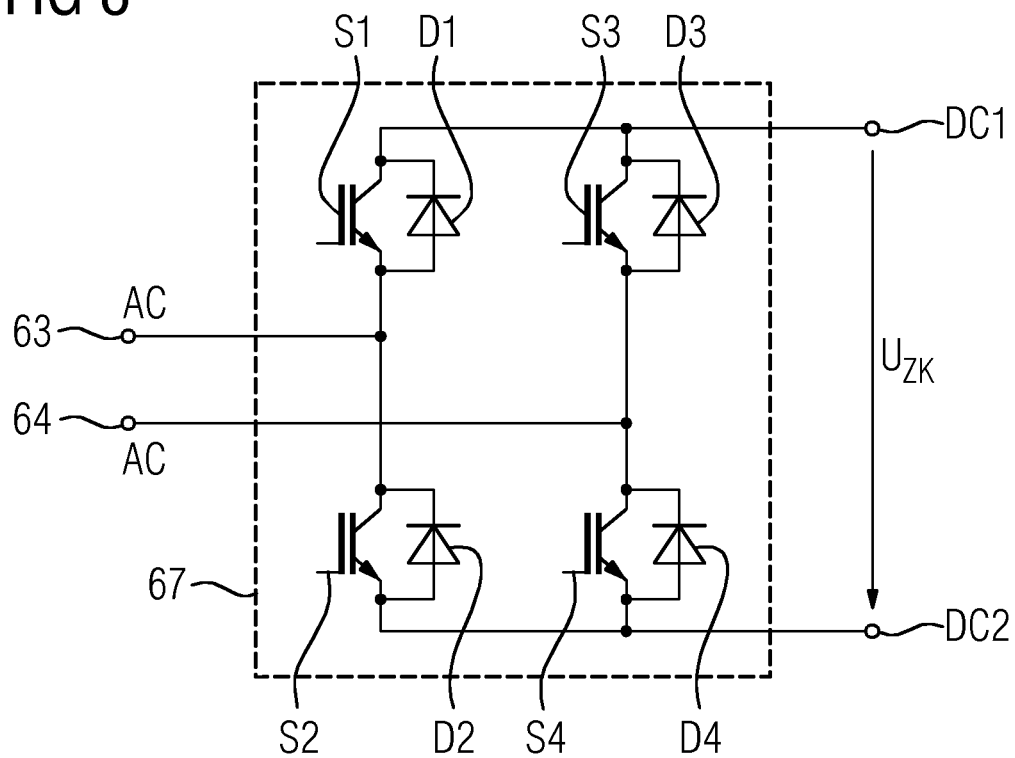
FIG. 8 illustrates an exemplary embodiment of the power module.

A first exemplary embodiment of the power module 67 is illustrated in FIG. 8. The power module 67 comprises four electronic switching elements S1-S4 (in particular, semiconductor switches S1-S4), which are arranged in a full-bridge circuit. A freewheeling diode D1-D4 is connected antiparallel with each electronic switching element S1-S4. The electronic switching elements can, for example, be IGBTs, IGCTs, IEGTs or MOSFETs. It can be seen in FIG. 8 that the intermediate circuit voltage $U_{ZK}$ occurs at the terminals DC1 and DC2.

Figure 9:
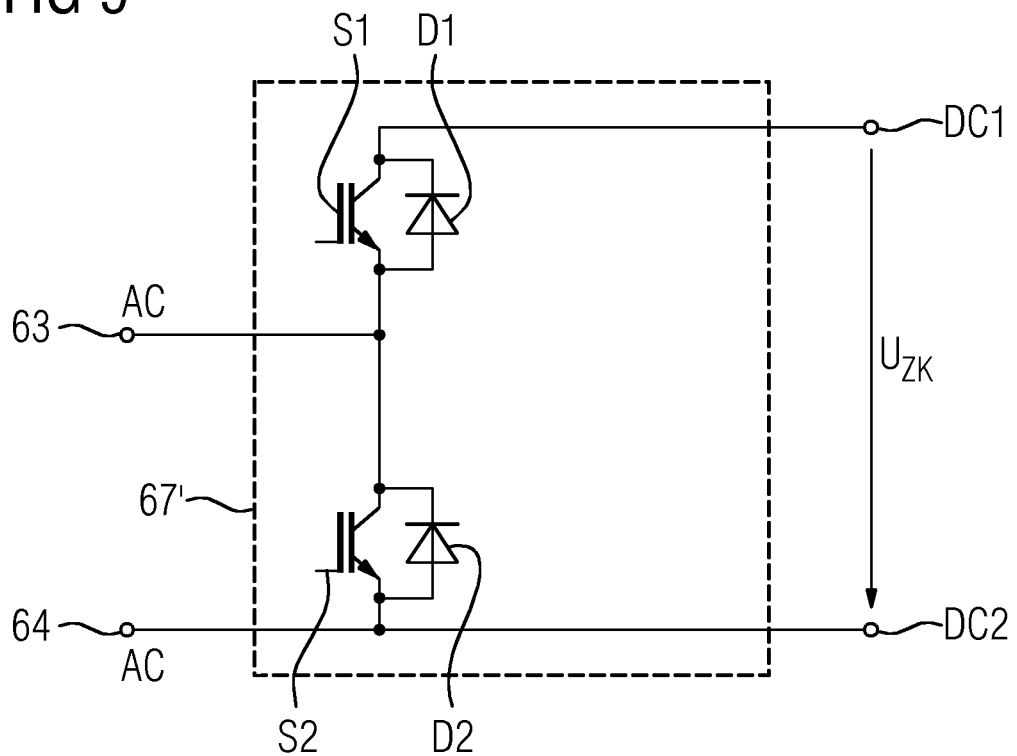
FIG. 9 illustrates a further exemplary embodiment of the power module.

A further exemplary embodiment of the power module 67' is illustrated in FIG. 9. This power module 67' only comprises two electronic switching elements S1 and S2, which are arranged in a half-bridge circuit. Power modules 67' with this kind of construction can in particular be employed in the modular multilevel power converter according to FIG. 4. Power modules 67 corresponding to FIG. 8 can be employed in all of the modular multilevel power converters illustrated in the exemplary embodiments.

Figure 10:
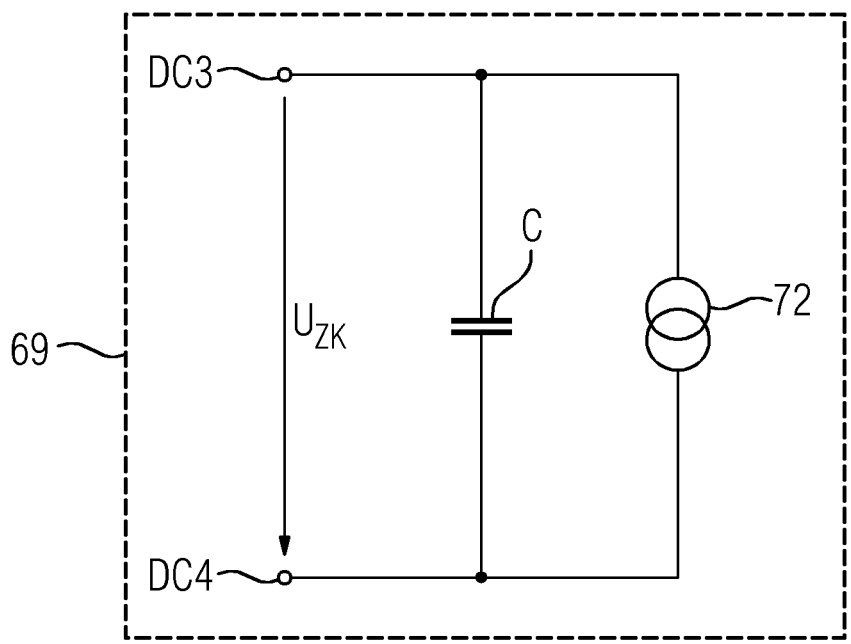
FIG. 10 illustrates an exemplary embodiment of the capacitor module.

An exemplary embodiment of the capacitor module 69 is illustrated in FIG. 10. The capacitor module 69 comprises a capacitor C (which functions as an intermediate store for electrical energy and, in particular, buffers the intermediate circuit voltage $U_{ZK}$) as an energy store, and, optionally, a voltage measuring device 72 connected in parallel with the capacitor C.

Figure 11:
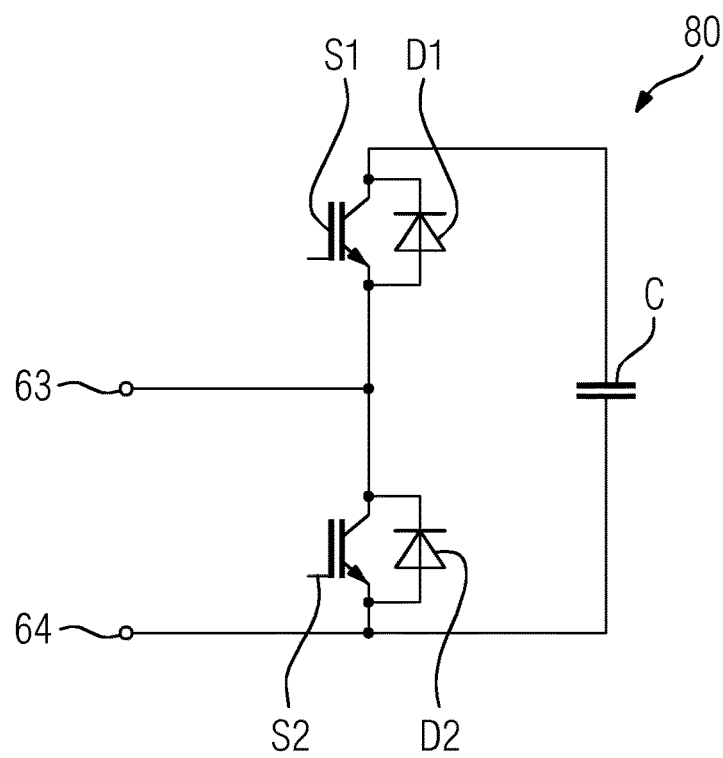
FIG. 11 illustrates a further illustration of an exemplary embodiment of a module in a half-bridge circuit.

A circuit diagram of a module 80 using half-bridge technology is illustrated once more in FIG. 11 in a different form of illustration (half-bridge module 80).

The module 80 comprises a first electronic switching element S1 (which can be switched off) (first semiconductor valve S1 that can be switched off) with a first diode D1 connected antiparallel. The module 80 further comprises a second electronic switching element S2 (which can be switched off) (second semiconductor valve S2 which can be switched off) with a second diode D2 connected antiparallel, as well as an electrical energy store in the form of a capacitor C. The first electronic switching element S1 and the second electronic switching element S2 are each designed as an IGBT (insulated-gate bipolar transistor). The first electronic switching element S1 is connected electrically in series with the second electronic switching element S2. A first galvanic module terminal 63 is arranged at the connection point between the two electronic switching elements S1 and S2. A second galvanic module terminal 64 is arranged at the terminal of the second electronic switching element S2 which is opposite the connection point. The second module terminal 64 is furthermore connected electrically to a first terminal of the energy store C; a second terminal of the energy store C is connected electrically to the terminal of the first electronic switching element S1 that is opposite the connection point.

The energy store C is thus connected electrically in parallel with the series circuit of the first electronic switching element S1 and the second electronic switching element S2. Through appropriate driving of the first electronic switching element S1 and the second electronic switching element S2 by the electronic drive unit 21 of the power converter, it is possible to ensure that either the voltage of the energy store C is output between the first module terminal 63 and the second module terminal 64, or that no voltage is output (i.e. a zero voltage is output). Through the interaction of the modules of the individual power converter paths, it is thus possible for a voltage desired at the time to be generated at the power converter paths.

Figure 12:
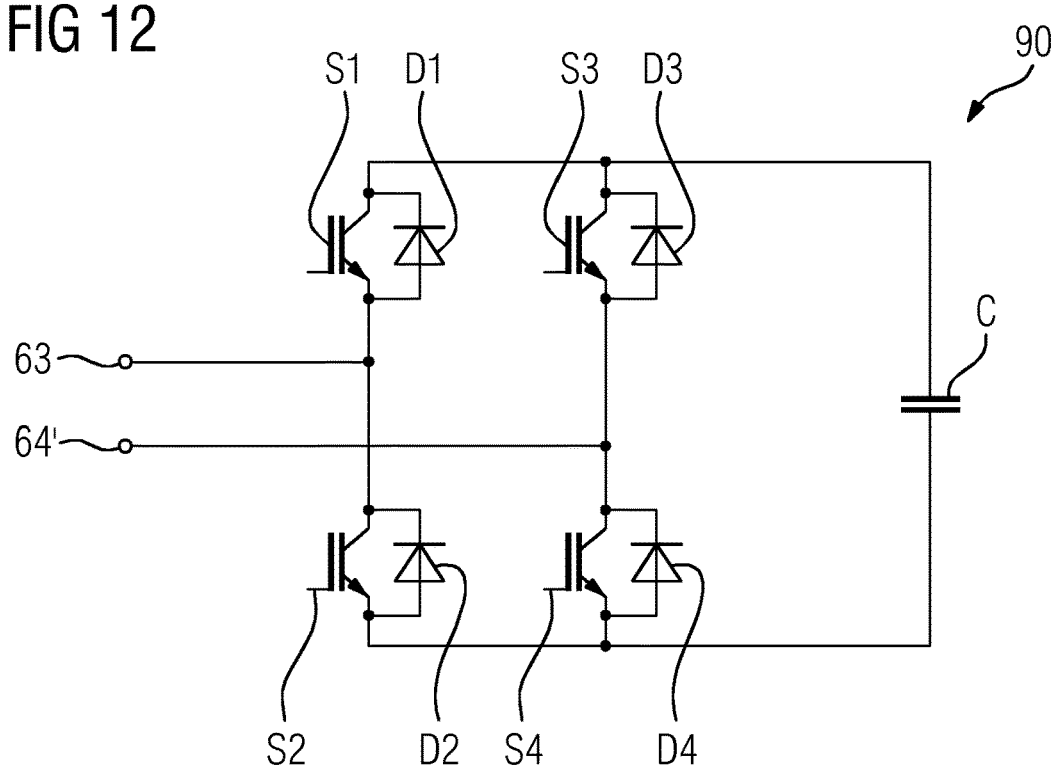
FIG. 12 illustrates a further illustration of an exemplary embodiment of a module in a full-bridge circuit.

A circuit diagram of a module 90 using full-bridge technology is illustrated once more in FIG. 12 in a different illustration (full-bridge module 90).

In addition to the first electronic switching element S1, second electronic switching element S2, first freewheeling diode D1, second freewheeling diode D2 and energy store C already known from FIG. 11, the module 90 illustrated in FIG. 12 comprises a third electronic switching element S3 with a third freewheeling diode D3 connected antiparallel, as well as a fourth electronic switching element S4 with a fourth freewheeling diode D4 connected antiparallel. The third electronic switching element S3 and the fourth electronic switching element S4 are each designed as an IGBT. In contrast to the circuit of FIG. 11, the second module terminal 64' is not connected electrically to the second electronic switching element S2, but to a central point of an electric series circuit consisting of the third electronic switching element S3 and the fourth electronic switching element S4.

This full-bridge module 90 is characterized in that with appropriate driving of the four electronic switching elements between the first (galvanic) module terminal 63 and the second (galvanic) module terminal 64', optionally either the positive voltage of the energy store C, the negative voltage of the energy store C, or a voltage with the value zero (zero voltage) can be output. The polarity of the output voltage can thus be reversed by means of the full-bridge module 90. The power converter paths of the multilevel power converter can comprise either just half-bridge modules 80, just full-bridge modules 90, or also half-bridge modules 80 and full-bridge modules 90.

Figure 13:
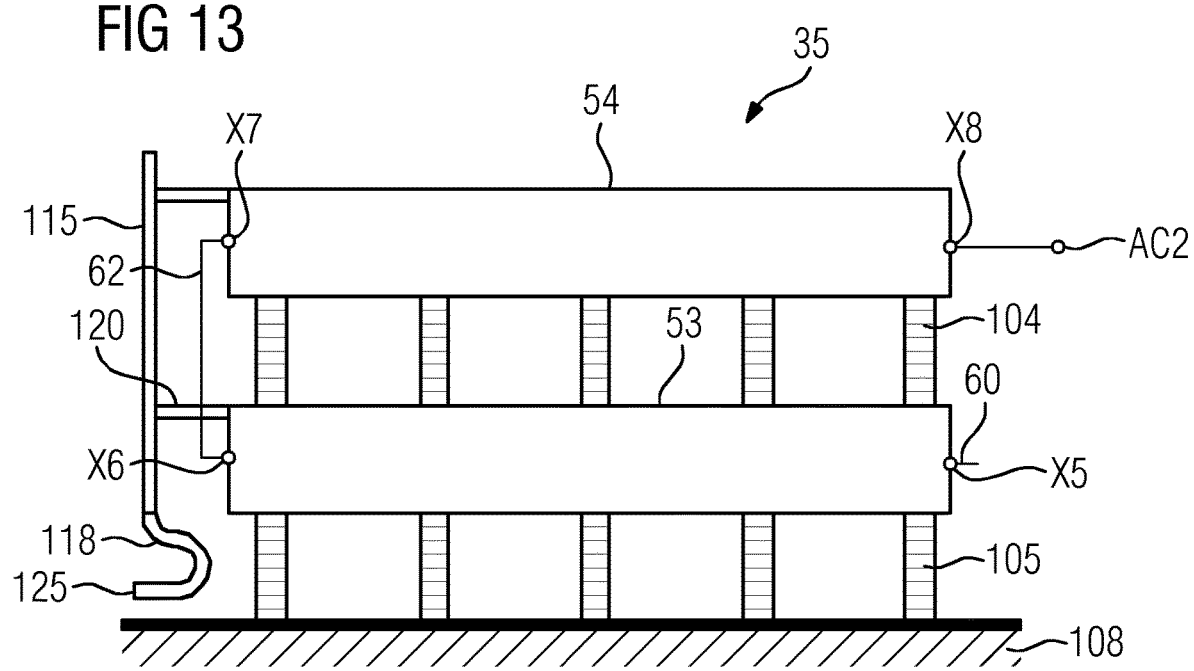
FIGS. 13 to 16 illustrate an exemplary embodiment of the mechanical construction of the power converter path.
Figure 14:
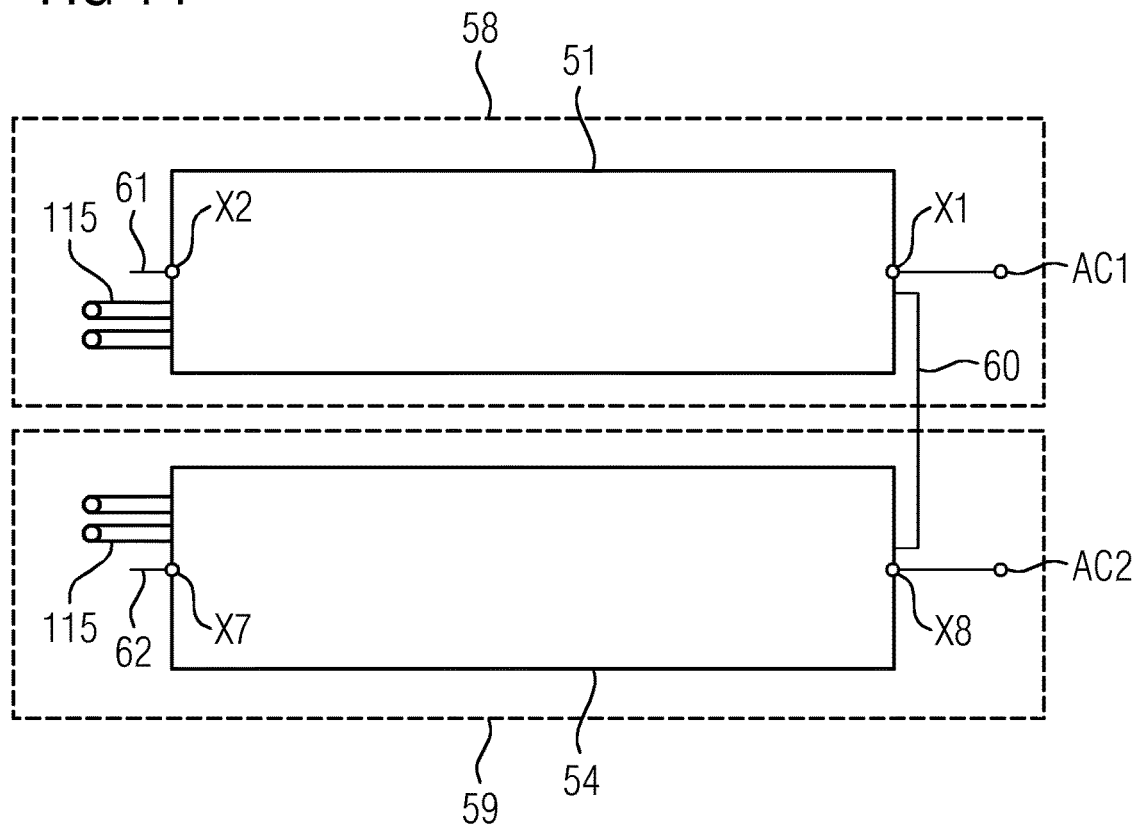
Figure 15:
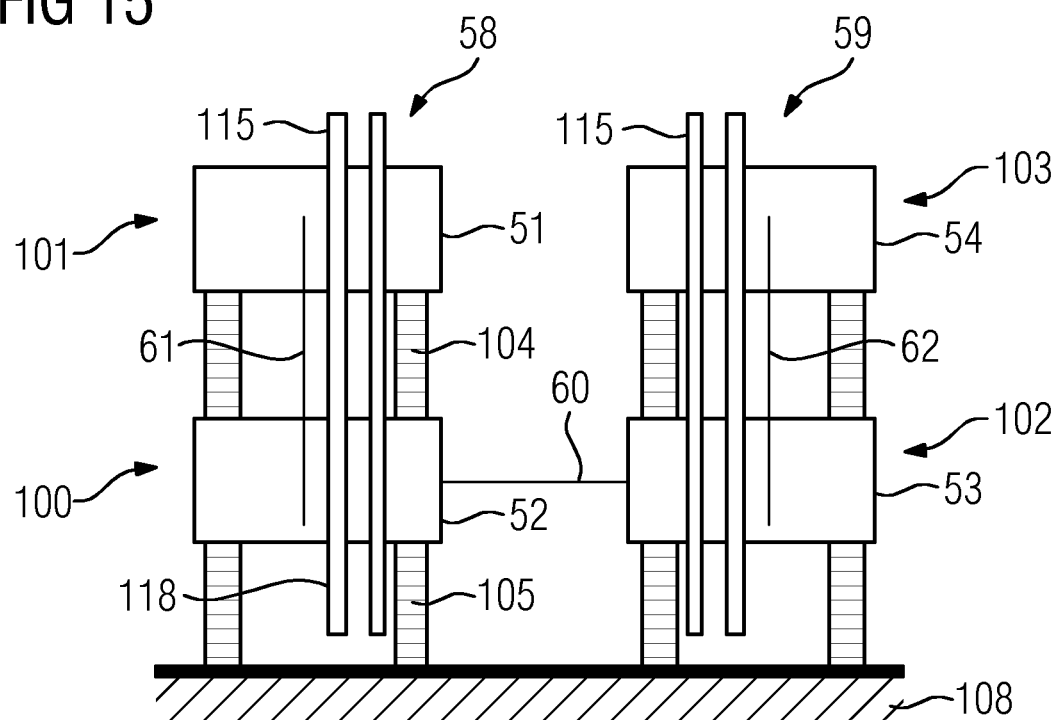
Figure 16:
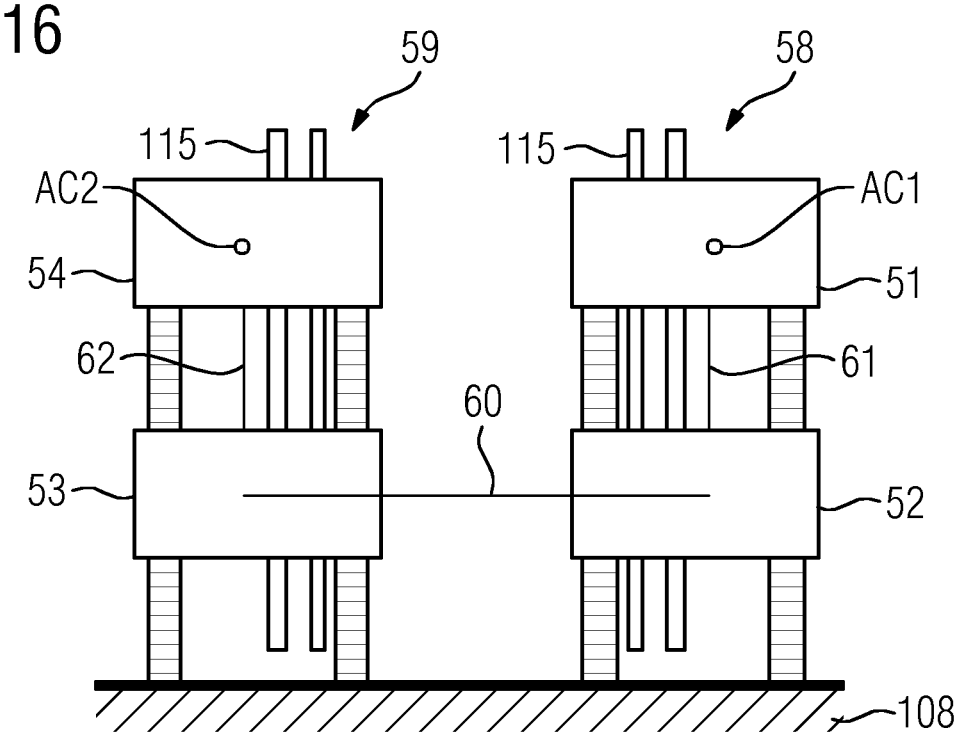
Figure 17:
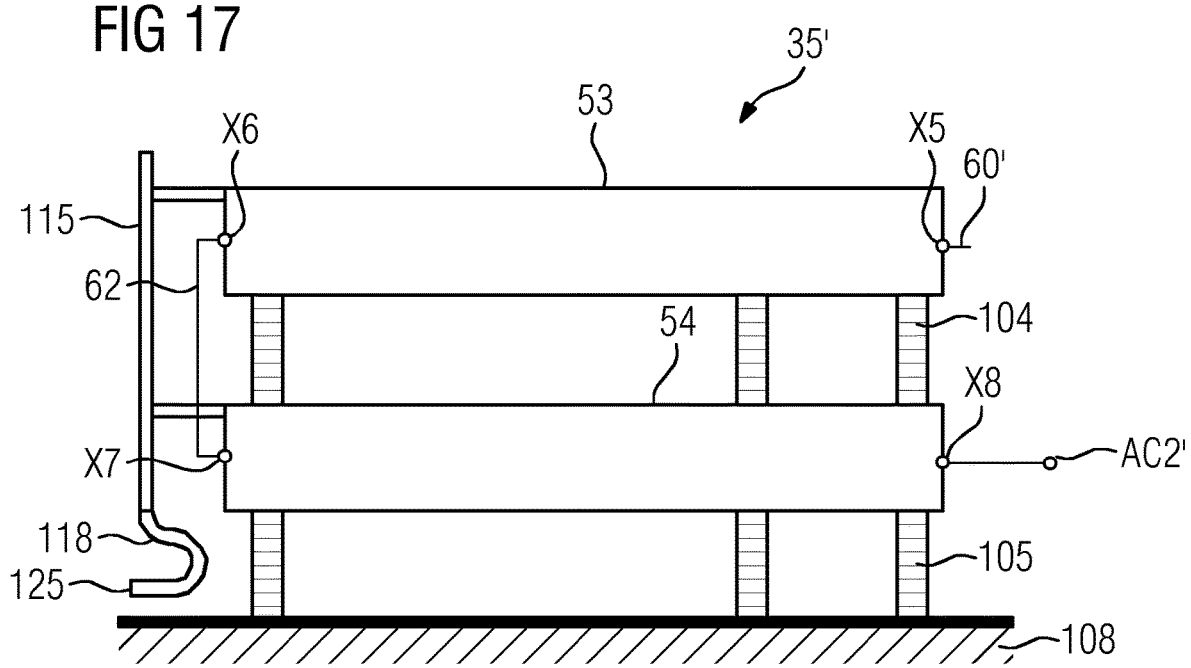
Figure 18:
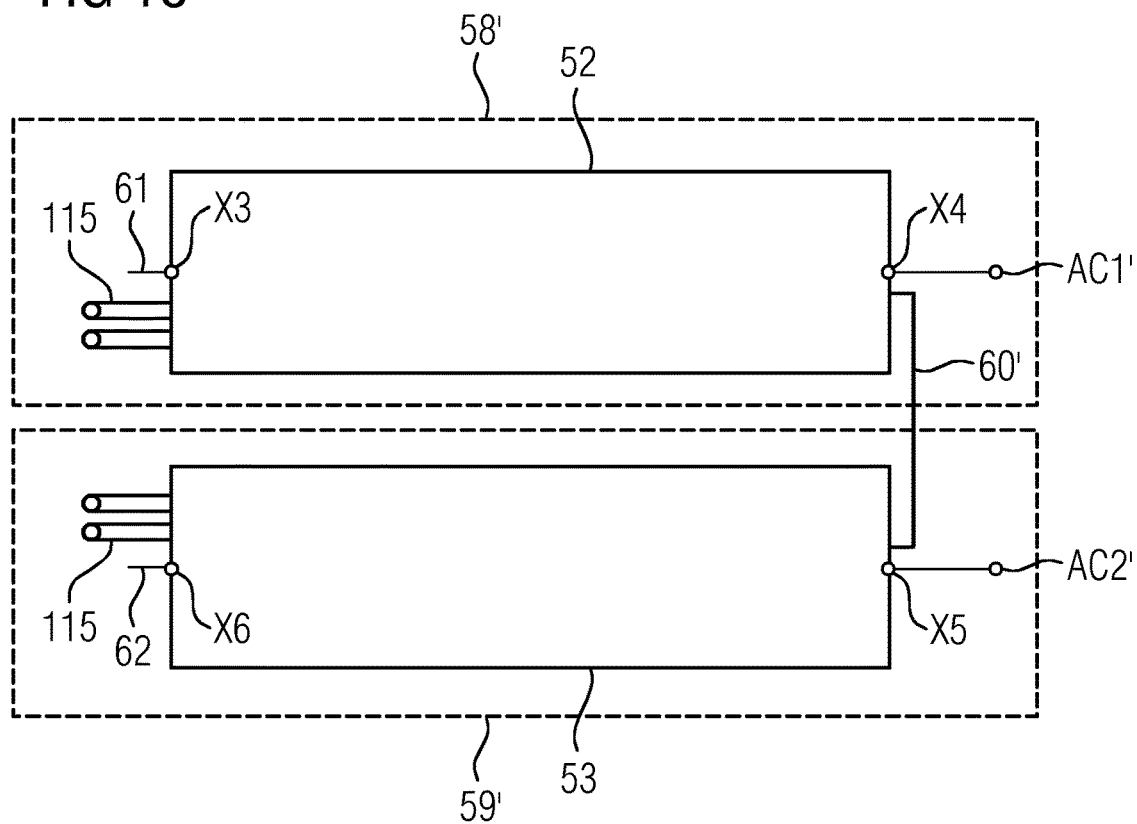

A first exemplary embodiment of the mechanical construction of the power converter path 35 is illustrated in FIGS. 13-16. FIG. 13 here shows a view from the front, FIG. 14 a view from above, FIG. 15 view from the left and FIG. 16 a view from the right. It can clearly be seen that the power converter path 35 comprises the first tower structure 58 and the second tower structure 59. The first tower structure 58 and the second tower structure 59 are arranged next to one another (at the same height), and are electrically connected to one another exclusively via the first connecting conductor 60. The first tower structure 58 and the second tower structure 59 are each designed to be mechanically self-supporting, so that each tower structure can be erected independently of the other tower structure. The first tower structure 58 comprises the modules of the second group 52 on a lower level 100 and the modules of the first group 51 on an upper level 101. The first group 51 and the second group 52 are here sequentially following groups of the power converter path; cf. FIG. 6. In the same way, the second tower structure 59 comprises the modules of the third group 53 on a lower level 102 and the modules of the fourth group 54 on an upper level 103. Each tower structure comprises the lower level and the upper level which are separated from one another by support insulators 104. The modules of the lower level 100, 102 are insulated by means of further support insulators 105 from a floor 108 (ground 108) which is at ground potential. The support insulators 104 and 105 here provide the electrical insulation of the modules of the lower level or of the upper level and the mechanical construction of the tower structures 58 and 59.

In the first tower structure 58, the modules of the first group 51 arranged on the upper level 101 are electrically connected by means of the second connecting conductor 61 to the modules of the second group 52 arranged on the lower level 100. The second electric connecting conductor 61 thus connects the upper level 101 to the lower level 100 of the first tower structure 58. In the second tower structure 59, the modules of the fourth group 54 are electrically connected by means of the further second connecting conductor 62 to the modules of the third group 53. The further second connecting conductor 62 of the second tower structure 59 thus connects the upper level 103 to the lower level 102 of the second tower structure 59. It can further be seen that the first path terminal AC1 is arranged on the upper level 101 of the first tower structure 58, and the second path terminal AC2 is arranged at the upper level 103 of the second tower structure 59. The second connecting conductor 61 is arranged at the side of the first tower structure 58 that is opposite the first path terminal AC1. The further second connecting conductor 62 is arranged at the side of the second tower structure 59 that is opposite the second path terminal AC2. The first connecting conductor 60 and the second connecting conductors 61, 62 can in particular each be designed as an electric busbar.

The two sequential groups 51 and 52 of the series circuit of the modules M are thus arranged one above the other and form the first tower structure 58. The two sequential groups 53 and 54 of the series circuit are also arranged one above the other and form the second tower structure 59.

It can clearly be seen in FIG. 13 that an electric current that flows through the fourth group 54 that is arranged on the upper level 103 of the second tower structure 59, the second connecting conductor 62 and the third group 53 that is arranged on the lower level 102 of the second tower structure 59 has a U-shaped current path. The current thus flows from the second path terminal AC2 horizontally in the direction of the second connecting conductor 62, then via the second connecting conductor 62 vertically in the direction of the other level 102 (i.e. downwards), and then on the level 102 (i.e. through the modules of the third group 53) horizontally back in the direction of the first connecting conductor 60. This corresponds to a U-shaped current path. A U-shaped current path of this sort is particularly advantageous, since with such a U-shaped current path a potential shut-down device for the power converter path (not illustrated in FIGS. 13-16) can be installed particularly easily and effectively.

In each case one of the two groups of a tower structure thus comprises the path terminal AC1 or AC2 (AC high-voltage terminal of the power converter path).

The two groups of the tower structure are electrically connected to one another via the second connecting conductor 61 or 62, wherein the second connecting conductor 61 or 62 is arranged on the side of the tower structure that is opposite the path terminal. The first tower structure 58 and the second tower structure 59 are electrically connected by means of the first electric connecting conductor 60, wherein the first connecting conductor 60 electrically connects together two respective groups that are arranged on the same level (at the same height).

It can also clearly be seen in FIG. 13 that the power converter path 35 comprises cooling pipes 115 for a coolant of a fluid cooling (in particular a liquid cooling system) of the modules. These cooling pipes 115 are arranged on that side of the second tower structure 59 on which the second connecting conductor 62 is arranged. This is that side of the second tower structure 59 that is opposite the second path terminal AC2. Each tower structure comprises two cooling pipes 115: a cooling pipe for feeding the coolant to the modules of the tower structure and a cooling pipe for the return of the heated coolant. The cooling pipes 115 form riser pipes that guide the coolant to the first level and the second level of the respective tower structure.

The cooling pipes 115 each comprise a meandering section 118. This meandering section serves to lengthen the leakage path between the electric potential of the lower level of the second tower structure 59 and the ground potential. The leakage path 118 is therefore arranged underneath a coolant feed or coolant outlet 120 of the modules of the lower level 102. The plane of the meandering section can here be arranged perpendicularly or parallel to a conceptual plane boundary surface that borders the outer contour of that side of the second tower structure 59 at which the second connecting conductor 62 is arranged. In the exemplary embodiment of FIG. 13, the plane of the meandering section is arranged perpendicularly to this boundary surface.

A coolant connection 125 of the cooling pipe 115 is provided for connection to a cooling plant that is not illustrated. The coolant connection 125 can thus be connected to the cooling plant, so that coolant can be fed into this coolant connection or coolant can be drawn off from this coolant connection.

In the exemplary embodiment of FIGS. 13-16, the first electric connecting conductor 60 connects the second group 52 that is arranged on the lower level 100 of the first tower structure 58 to the third group 53 of modules that is arranged on the lower level 102 of the second tower structure 59. The first path terminal AC1 is arranged on the upper level 101 of the first tower structure 58, and the second path terminal AC2 is arranged on the upper level 103 of the second tower structure 59.

A further exemplary embodiment of a power converter path 35' is illustrated in FIGS. 17-20. This power converter path 35' differs from the power converter path 35 illustrated in FIGS. 13-16 in that the first connecting conductor 60' electrically connects the group 52 of modules arranged on the upper level 101' of the first tower structure 58' to the group 53 of modules arranged on the upper level 103' of the second tower structure 59'. In addition, in the exemplary embodiment of the FIGS. 17-20, the first path terminal AC1' is arranged on the lower level 100' of the first tower structure 58', and the second path terminal AC2' is arranged on the lower level 102' of the second tower structure 59'. Otherwise, the power converter path 35' according to FIGS. 17-20 is constructed in the same way as the power converter path 35 according to FIGS. 13-16.

The power converter path described and the modular multilevel power converter described have a range of advantages. They have a relatively low area requirement, since the first tower structure and the second tower structure each comprise two levels. The first tower structure and the second tower structure furthermore each only have a relatively low height, since no more than two levels are present in each tower structure. The path terminals can advantageously be arranged both at the height of the upper level (path terminals AC1 and AC2) as well as at the height of the lower level (path terminals AC1' and AC2'), so that the height of the path terminals is variable. The path terminals can thus also be realized optionally at two different heights for power converter paths of different power. This makes it possible to realize equal path terminal heights for different projects with different powers.

If the path terminals are arranged on the upper levels of the tower structures, a significant space results underneath the path terminals which can in particular be used for servicing or repair of the power converter path. The U-shaped current path realized in the power converter path permits an effective and simple potential control of the power converter path. A triple U-shaped current path is realized here at each power converter path: a first U-shaped current path exists in the first tower structure, and a second U-shaped current path in the second tower structure. A third U-shaped current path is realized through the connection of the two tower structures by means of the first connecting conductor 60 or 60', which is arranged at that level of the two tower structures at which they are electrically connected by means of the first connecting conductor 60 or 60'.

The series connection of the power converter path can comprise a large number of modules. The power converter can thereby also be employed for very high voltages. In particular, an economical embodiment of power converters with powers that can reach 300 MVar and more results.

A power converter path and a modular multilevel power converter are described, which can be constructed in a particularly compact and thereby economical form.

The invention claimed is:

1. A power converter path of a modular multilevel power converter, the power converter path including:
   a multiplicity of modules forming an electric series circuit;
   said series circuit including four groups of modules; and
   said four groups of modules including a first two sequential groups disposed one above another in a first tower structure and a second two sequential groups disposed one above another in a second tower structure disposed next to said first tower structure.

2. The power converter path according to claim 1, wherein one of said first two sequential groups is disposed on a lower level of said first tower structure, and the other of said first two sequential groups is disposed on an upper level of said first tower structure.

3. The power converter path according to claim 1, which further comprises a first electric connecting conductor electrically interconnecting said groups disposed in said first tower structure and said groups disposed in said second tower structure.

4. The power converter path according to claim 3, wherein:
said first tower structure has upper and lower levels;
said second tower structure has upper and lower levels; and
said first electric connecting conductor electrically connects said group disposed on said lower level of said first tower structure to said group disposed on said lower level of said second tower structure, or
said first electric connecting conductor electrically connects said group disposed on said upper level of said first tower structure to said group disposed on said upper level of said second tower structure.

5. The power convertor path according to claim 4, which further comprises:
a first path terminal and a second path terminal;
said first path terminal being disposed at said first tower structure; and
said second path terminal being disposed at said second tower structure.

6. The power converter path according to claim 5, wherein:
said first path terminal is disposed on said lower level of said first tower structure, and said second path terminal is disposed on said lower level of the second tower structure, or
said first path terminal is disposed on said upper level of said first tower structure, and said second path terminal is disposed on said upper level of said second tower structure.

7. The power converter path according to claim 6, which further comprises a second connecting conductor disposed at a side of said tower structure disposed opposite said path terminal, said second electric connecting conductor electrically connecting said group disposed on said upper level of said tower structure to said group disposed on said lower level of said tower structure.

8. The power converter path according to claim 7, which further comprises a U-shaped current path for a current flowing through said group disposed on said upper level of said tower structure, said second connecting conductor and said group disposed on said lower level of said tower structure.

9. The power convertor path according to claim 7, wherein at least one of said first connecting conductor or said second connecting conductor is an electric busbar.

10. The power convertor path according to claim 7, which further comprises a cooling pipe for fluid cooling of said modules, said cooling pipe being disposed at a side of said tower structure at which said second connecting conductor is disposed.

11. The power converter path according to claim 10, wherein said cooling pipe includes a meandering section.

12. The power converter path according to claim 11, wherein said meandering section is disposed in a plane being perpendicular or parallel to a conceptual plane boundary surface bordering an outer contour of a side of said tower structure at which said second connecting conductor is disposed.

13. The power converter path according to claim 1, wherein each respective group of modules includes between 8 and 16 modules.

14. The power converter path according to claim 1, wherein said modules each include at least two respective electronic switching elements and a respective electrical energy store.

15. A modular multilevel power converter, comprising a power converter path according to claim 1.

16. The power converter path according to claim 1, wherein each of said first tower structure and said second tower structure has a height limited to only two levels.

* * * * *